(12) United States Patent
Thömmes

(10) Patent No.: US 9,057,750 B2
(45) Date of Patent: Jun. 16, 2015

(54) TEST OF A TESTING DEVICE FOR DETERMINING A VOLTAGE STATE OF A HIGH-VOLTAGE VEHICLE ELECTRICAL SYSTEM

(75) Inventor: Marco Thömmes, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 13/997,074

(22) PCT Filed: Nov. 17, 2011

(86) PCT No.: PCT/EP2011/005796
§ 371 (c)(1),
(2), (4) Date: Jun. 21, 2013

(87) PCT Pub. No.: WO2012/084102
PCT Pub. Date: Jun. 28, 2012

(65) Prior Publication Data
US 2013/0293237 A1 Nov. 7, 2013

(30) Foreign Application Priority Data
Dec. 24, 2010 (DE) .......................... 10 2010 056 235

(51) Int. Cl.
*G01R 31/00* (2006.01)
*B60L 3/00* (2006.01)
(Continued)

(52) U.S. Cl.
CPC ............. *G01R 31/006* (2013.01); *B60L 3/0069* (2013.01); *B60L 3/04* (2013.01); *B60L 2250/10* (2013.01); *G01R 19/155* (2013.01); *G01R 35/00* (2013.01)

(58) Field of Classification Search
CPC .. G01R 27/18; G01R 31/3648; G01R 31/025; E05F 15/0017
USPC ......... 324/426, 434, 433, 503; 701/29.1–31.9
See application file for complete search history.

(56) References Cited

U.S. PATENT DOCUMENTS 5,900,734 A * 5/1999 Munson ........................ 324/433
6,828,914 B2 * 12/2004 Zur et al. .................... 340/636.1
(Continued)

FOREIGN PATENT DOCUMENTS

DE 44 36 372 4/1996
DE 102 12 493 10/2003
(Continued)

OTHER PUBLICATIONS

International Search Report issued by the European Patent Office in International Application PCT/EP2011/005796.

*Primary Examiner* — Tung X Nguyen
*Assistant Examiner* — Alesa Allgood
(74) *Attorney, Agent, or Firm* — Henry M. Feiereisen LLC

(57) ABSTRACT

A method for testing a testing device for determining a voltage state of an on-board high-voltage electrical system of a motor vehicle includes establishing a predetermined voltage state in the on-board high-voltage electrical system by supplying a test voltage to the on-board high-voltage electrical system and determining the voltage state with the testing device and comparing the determined voltage state with the predetermined voltage state This ensures that, before maintenance work on the on-board high-voltage electrical system is performed, a voltage-free state of the on-board high-voltage electrical system determined by the testing device is actually present, thereby eliminating risk to maintenance personnel due to an accidentally applied voltage.

9 Claims, 1 Drawing Sheet

(51) Int. Cl.
*B60L 3/04* (2006.01)
*G01R 35/00* (2006.01)
*G01R 19/155* (2006.01)

(56) References Cited

U.S. PATENT DOCUMENTS

| | | | |
|---|---|---|---|
| 6,864,688 B2 | 3/2005 | Beutelschiess et al. | |
| 7,709,977 B2 * | 5/2010 | Jansen et al. | 307/87 |
| 8,004,285 B2 * | 8/2011 | Endou | 324/522 |
| 2009/0140743 A1 * | 6/2009 | Ohnuki | 324/426 |
| 2011/0022261 A1 | 1/2011 | Pushkolli et al. | |

FOREIGN PATENT DOCUMENTS

| | | |
|---|---|---|
| DE | 102005052782 | 5/2007 |
| DE | 102006050529 | 4/2008 |
| DE | 102007061729 | 6/2009 |
| DE | 102008006223 | 8/2009 |
| EP | 1 222 087 | 3/2006 |

* cited by examiner

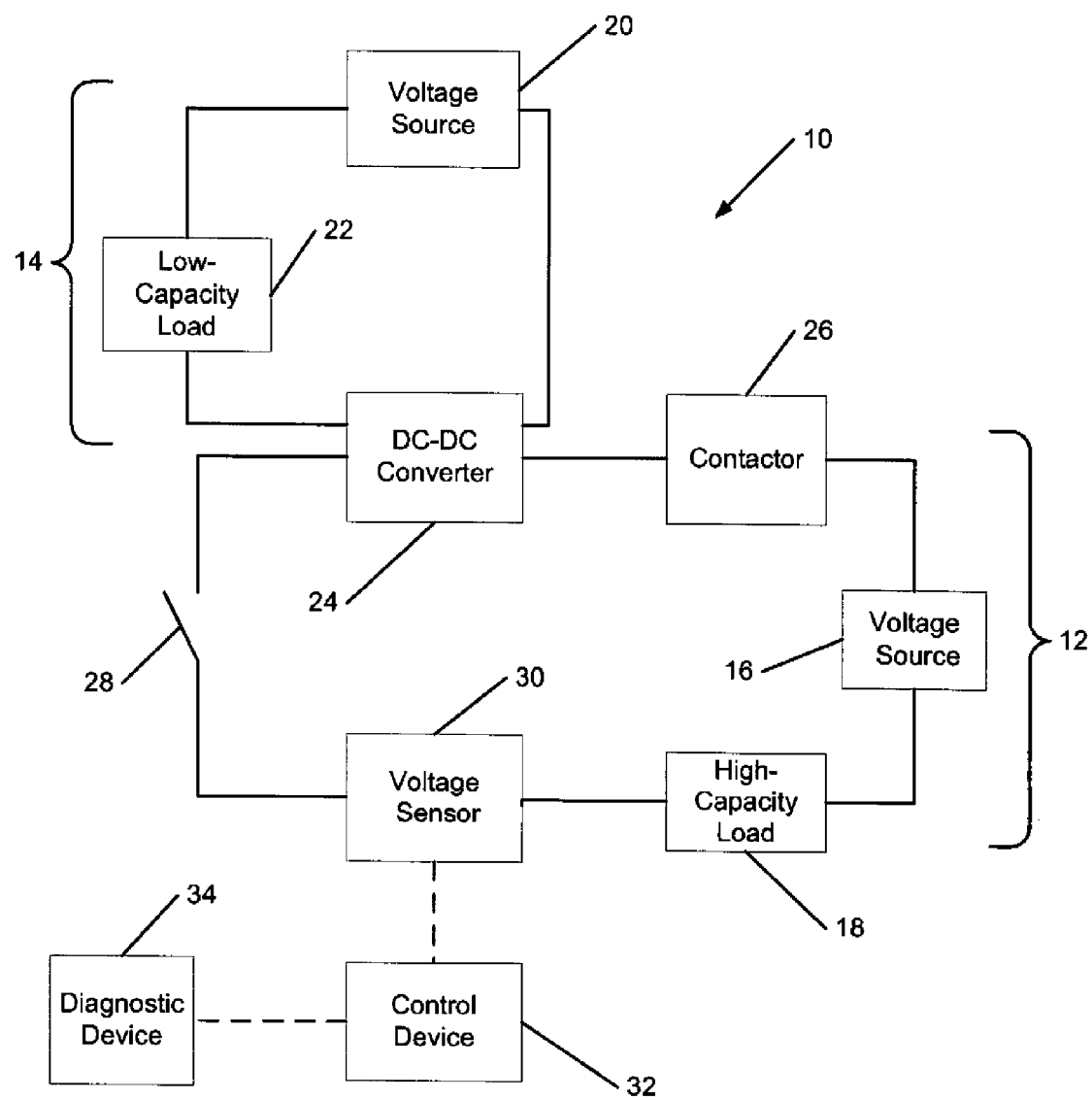

TEST OF A TESTING DEVICE FOR DETERMINING A VOLTAGE STATE OF A HIGH-VOLTAGE VEHICLE ELECTRICAL SYSTEM

CROSS-REFERENCES TO RELATED APPLICATIONS

This application is the U.S. National Stage of International Application No. PCT/EP2011/005796, filed Nov. 17, 2011, which designated the United States and has been published as International Publication No. WO 2012/084102 A1 and which claims the priority of German Patent Application, Serial No. 10 2010 056 235.1, filed Dec. 24, 2010, pursuant to 35 U.S.C. 119(a)-(d).

BACKGROUND OF THE INVENTION

The invention relates to a method for testing a testing device for determining a voltage condition of an on-board high-voltage electrical system of a motor vehicle.

Vehicles with electric or hybrid drive have powerful voltage sources for supplying electric drive units with energy. To reduce the thermal voltage of such a on-board high-voltage electrical system, operating voltages of 400 V or more are typically used, which pose a significant risk to operating or maintenance personnel upon contact. The voltage-free state of the on-board high voltage electrical system must therefore be ensured during repair or maintenance work on such motor vehicles.

Normally, a testing device is provided for detecting the voltage state of the on-board high-voltage electrical system. Such testing device may be integrated in the motor vehicle or may be part of an external testing device to be connected to the motor vehicle during maintenance work.

When a determination is made with such testing device that the on-board high-voltage electrical system is not live, it must also be ensured that this result is not due to a malfunction of the testing device. Therefore, the voltage state is usually observed when the on-board high voltage electrical system is switched off. When the on-board voltage decreases in this case from the operating voltage to zero, it is ensured that the testing device is working properly and the on-board high-voltage electrical system is now in fact voltage-free.

However, this can only be done when the on-board high-voltage electrical system is in a ready state. However, this is not always the case during maintenance or repair work. In these situations, there is therefore an additional risk for the service personnel.

For example, the on-board high-voltage electrical system may de-energized due to a defective contactor. When work is now performed on the on-board electrical system while relying on the voltage-free state without reliably and permanently de-energizing the on-board high-voltage electrical system by opening a service switch, then it may happen that the defective contactor closes again, so that the -board high-voltage electrical system is re-energized. Therefore, it must also be additionally ensured that the voltage-free state of the on-board high-voltage electrical system is permanent and is due to opening a service switch or another intentional interruption of the circuit.

SUMMARY OF THE INVENTION

It is therefore the object of the present invention to provide a method of the aforedescribed type, which enables a reliable determination of a voltage state of an on-board high-voltage electrical system in a motor vehicle.

In a method according to the invention for testing a testing device for determining a voltage condition of an on-board high-voltage electrical system of a motor vehicle, a predetermined voltage state is established in the on-board high-voltage electrical system by supplying a test voltage to the on-board high-voltage electrical system. Thereafter, the voltage state determined by the test apparatus is compared with the predetermined voltage state.

If the voltage states agree, then it can be assumed that the testing device is functioning properly. When the test facility now shows a drop in voltage in the on-board high-voltage electrical system to zero when a service switch is subsequently opened or in a similar intentional interruption of the on-board high-voltage electrical system, a secure voltage-free state of the on-board high-voltage electrical system can be assumed so that maintenance and repair work can be safely performed.

Other hand, a deviation between the predetermined voltage state and the actual voltage state is an indication of a malfunction of the testing device. Accordingly, special safety measures must be taken during subsequent maintenance and repair work. An erroneous assessment of the on-board high-voltage electrical system as voltage-free as can hence be reliably prevented.

In a preferred embodiment of the invention, current flow in the on-board high-voltage electrical system is interrupted by opening a switch while the test voltage is supplied and it is checked whether the voltage of the on-board high-voltage electrical system drops to zero. If this is the case, then it is ensured that the on-board high-voltage electrical system is physically interrupted and permanently voltage-free. In contrast to conventional procedures, this can be reliably detected even when another interruption in the on-board high-voltage electrical system already exists, for example due to a defective component. Also in these situations, work can be safely performed on the on-board high-voltage electrical system.

Preferably, a signal is generated when the actual voltage state deviates from the predetermined voltage state. This may be a visual or an audible signal. Operators or maintenance personnel can then be reliably warned of a potentially unsafe condition of the on-board high-voltage electrical system by such signal.

Additionally or alternatively, when a deviation is detected, information relating to such a deviation may be stored in a memory device. This information can be read during subsequent maintenance or repair work and may serve as a warning of potential dangers. By storing this information for later readout, the method may also be executed automatically, independent of upcoming maintenance work.

Advantageously, the method may be performed each time before the on-board high-voltage network is switched off. The functionality of the testing device is then already be continuously monitored during normal operation of the motor vehicle, so reliable information about potential problems and risks can be read from the memory device during maintenance work.

Additionally or alternatively, the method can also be performed immediately before upcoming maintenance and/or repair work. This ensures that no new error has occurred since the last test of the testing device, rendering the information obtained about the functionality of the testing device particularly reliable.

In another preferred embodiment of the invention, the supplied voltage is less than 60 V. Such low voltages do not represent a health risk upon contact, so that the process can be safely performed during already ongoing maintenance work on the on-board high-voltage electrical system.

Advantageously, the test voltage is provided by a voltage converter from an on-board low-voltage electrical system of the motor vehicle. The test voltage can then be supplied to the on-board high-voltage electrical system of the motor vehicle without any external support, when the on-board high-voltage electrical system is not functioning due to a failure of a component. No additional components are required, because such a voltage converter which connects the on-board high-voltage electrical system with the on-board low-voltage electrical system, typically a 12V electrical system, is usually present anyway.

Alternatively, the test voltage may be provided by an external voltage source. The external voltage is suitably connected to the on-board high-voltage electrical system by a plug protected against accidental contact, so as not to endanger the operating personnel when the state of the on-board high-voltage electrical system is unknown. When using an external voltage source, the method can be performed even when the low voltage electrical system has failed.

According to another embodiment of the invention, the test voltage is provided by a pre-charging circuit of an energy storage device of the on-board high-voltage electrical system. Such energy storage devices are used to stabilize the on-board high-voltage electrical system during switch-on and switch-off operations. The energy storage devices may also be, for example, capacitors. The pre-charging circuit is so named because it pre-charges these capacitors, i.e. is used to generate a predetermined charging state of the energy storage device upon activation of the on-board electrical system and is configured to provide voltages in the range of the desired test voltage. Advantageously, no additional components are therefore needed.

BRIEF DESCRIPTION OF THE DRAWING

The invention and its embodiments will now be described with reference to the drawing, wherein FIG. 1 shows a schematic diagram of an electrical system of a motor vehicle.

DETAILED DESCRIPTION OF PREFERRED EMBODIMENTS

An on-board electrical system of a motor vehicle designated overall with the reference symbol 10 is divided into an on-board high-voltage electrical system 12 and an on-board low-voltage electrical system 14. A voltage source 16 in the on-board high-voltage electrical system 12 a voltage of typically 400 V to 650 V for operating high-capacity loads 18, for example drive systems of electric or hybrid vehicles.

A further voltage source 20 provides in the on-board low-voltage electrical system 14 a voltage of typically 12 V for lower capacity loads 22, such as control devices and the like. The on-board high-voltage electrical system 12 is also electrically coupled to the on-board low-voltage electrical system 14 via a DC-DC converter 24.

Since the high voltage in the on-board high-voltage electrical system 12 presents a danger for operators and maintenance personnel, a contactor 26 for disconnecting the voltage source 16 from the on-board high-voltage electrical system 12 is also provided. The contactor 26 interrupts the on-board high-voltage electrical system 12 in the event of a malfunction and when the motor vehicle is deactivated. During maintenance and repair work, the on-board high-voltage electrical system 12 may also be interrupted with a so-called service switch 28 manually and independent of the control of the contactor 26. A plug may also be used instead of the service switch 28, which may be pulled manually for interrupting the on-board high-voltage electrical system 12. Pulling the plug or operating the switch may hereby directly interrupt a line of on-board high-voltage electrical system 12 or may interrupt a control line of the contactor 26, thereby disconnecting power to the contactor 26 and causing the contactor 26 to open.

To ensure the safety of the maintenance personnel when working on the on-board high-voltage electrical system 12, the voltage state of the on-board high-voltage electrical system 12 must also be monitored. For this purpose, a voltage sensor 30 is provided which can be used before a work activity commences whether the on-board high-voltage electrical system 12 is indeed voltage-free. The measured values from the voltage sensor 30 are read by a control device 32 and transmitted to an external diagnostic device 34. The measured values can also be additionally or alternatively transmitted to an internal diagnostic unit of the motor vehicle.

It is important to determine whether the voltage-free state of the on-board high-voltage electrical system 12 is actually caused by the opening of the service switch 28. When this is not the case, for example, when the on-board high-voltage electrical system 12 is voltage-free before the service switch 28 is opened due to a defect, work may be performed on on-board high-voltage electrical system 12 when the service switch is closed 28. When the defect is then eliminated, the on-board high-voltage electrical system 12 would be again energized, which would represents a significant risk for the maintenance personnel.

This can be prevented by observing the voltage measured by the voltage sensor 30 when the service switch is opened. Work on the on-board electrical system 10 can be safely performed only when a decrease of the measured voltage drops from the normal operating voltage of the on-board high-voltage electrical system 12 to zero is observed.

However, this is not possible when the on-board high-voltage electrical system is already voltage-free when the service switch 28 is closed. In this case, a test voltage of less than 60 V is therefore supplied by the voltage converter 24 from the on-board low-voltage electrical system 14 to the on-board high-voltage electrical system 12. When a decrease in the voltage measured by the sensor 30 from the test voltage to zero is observed when the service switch 28 is opened, the desired safe state of the on-board high-voltage electrical system is ensured.

Supplying a test voltage from the on-board low-volt electrical system 14 can also be used for an automatic diagnosis of the functionality of the voltage sensor 30. A predefined test voltage is hereby supplied in the voltage-free state of the on-board high-voltage electrical system 12, for example when the contactor 26 is open, and this test voltage is compared to the voltage measured by the voltage sensor 30. When the measured deviates from the supplied voltage, the voltage sensor 30 is considered as defective and corresponding information is stored in the control device 32. This information can be read out by the external diagnostic device 32 during the next maintenance of the motor vehicle, thereby informing the maintenance personnel immediately about possible risks. Such automated test of the voltage sensor can be performed, for example, each time the motor vehicle is deactivated.

What is claimed is:

1. A method for determining with a testing device a safe voltage state of an on-board high-voltage electrical system of a motor vehicle, comprising:

disconnecting a high-voltage source of the motor vehicle from the on-board high-voltage electrical system by opening a contactor thereby producing an isolated on-board high-voltage electrical system having a voltage-free state, and while the high-voltage source is disconnected from the isolated on-board high-voltage electrical system, performing the following steps:

supplying a test voltage having a safe voltage level smaller than a voltage of the high-voltage source to the isolated high-voltage on-board electrical system at a feed point of the isolated high voltage on-board electrical system so as to produce a predetermined voltage state in the isolated high voltage on-board electrical system, determining with the testing device connected to the isolated high voltage on-board electrical system an actual voltage state in the isolated high voltage on-board electrical system, comparing the actual voltage state with the predetermined voltage state, while the test voltage is being supplied to the isolated high voltage on-board electrical system, electrically disconnecting the feed point from the testing device by opening a service switch which is different from the contactor, and checking with the testing device, whether the actual voltage in the isolated on-board high-voltage electrical system drops to zero in response to opening the service switch.

2. The method of claim 1, further comprising generating a signal when the actual voltage state deviates from the predetermined voltage state.

3. The method of claim 1, wherein the method is performed immediately before an upcoming maintenance or repair work.

4. The method of claim 1, wherein the test voltage is less than 60V.

5. The method of claim 1, wherein the test voltage is provided by a voltage converter from an on-board low-voltage electrical system of the motor vehicle.

6. The method of claim 1, wherein the test voltage is provided by an external voltage source which is connected to the on-board high-voltage electrical system by a plug protected against accidental contact.

7. The method of claim 1, wherein the test voltage is provided by a pre-charging circuit for an energy storage device of the on-board high-voltage electrical system.

8. The method of claim 1, further comprising, when the actual voltage state deviates from the predetermined voltage state, storing information relating to the deviation in a memory device.

9. The method of claim 8, wherein the method is automatically performed each time the on-board high-voltage electrical system is switched off.

* * * * *